United States Patent
Yang et al.

(10) Patent No.: US 12,160,953 B2
(45) Date of Patent: Dec. 3, 2024

(54) CIRCUIT BOARD STRUCTURE AND MANUFACTURING METHOD THEREOF

(71) Applicant: Unimicron Technology Corp., Taoyuan (TW)

(72) Inventors: Kai-Ming Yang, Hsinchu County (TW); Chia-Yu Peng, Taoyuan (TW); Cheng-Ta Ko, Taipei (TW); Pu-Ju Lin, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 188 days.

(21) Appl. No.: 17/992,933

(22) Filed: Nov. 23, 2022

(65) Prior Publication Data

US 2024/0138059 A1 Apr. 25, 2024
US 2024/0237202 A9 Jul. 11, 2024

(30) Foreign Application Priority Data

Oct. 21, 2022 (TW) .................................. 111139981

(51) Int. Cl.
*H05K 1/11* (2006.01)
*H05K 1/02* (2006.01)
*H05K 3/46* (2006.01)

(52) U.S. Cl.
CPC ............ *H05K 1/0298* (2013.01); *H05K 1/11* (2013.01); *H05K 3/4644* (2013.01); *H05K 2203/041* (2013.01)

(58) Field of Classification Search
CPC ...... H05K 1/0298; H05K 1/11; H05K 3/4644; H05K 2203/041

(Continued)

(56) References Cited

U.S. PATENT DOCUMENTS 5,534,466 A * 7/1996 Perfecto .............. H01L 23/5385
216/20
6,183,588 B1 * 2/2001 Kelly ..................... B32B 43/00
438/455

(Continued)

FOREIGN PATENT DOCUMENTS

TW I398936 6/2013
TW 201814866 4/2018

(Continued)

OTHER PUBLICATIONS

"Office Action of Taiwan Counterpart Application", issued on Jun. 5, 2023, p. 1-p. 10.

*Primary Examiner* — Timothy J Thompson
*Assistant Examiner* — Michael F McAllister
(74) *Attorney, Agent, or Firm* — JCIPRNET

(57) ABSTRACT

A circuit board structure includes a carrier, a thin film redistribution layer disposed on the carrier, solder balls electrically connected to the thin film redistribution layer and the carrier, and a surface treatment layer. The thin film redistribution layer includes a first dielectric layer, pads, a first metal layer, a second dielectric layer, a second metal layer, and a third dielectric layer. A top surface of the first dielectric layer is higher than an upper surface of each pad. The first metal layer is disposed on a first surface of the first dielectric layer. The second dielectric layer has second openings exposing part of the first metal layer. The second metal layer extends into the second openings and is electrically connected to the first metal layer. The third dielectric layer has third openings exposing part of the second metal layer. The surface treatment layer is disposed on the upper surfaces.

19 Claims, 19 Drawing Sheets

(58) Field of Classification Search
USPC .......................................................... 174/261
See application file for complete search history.

(56) References Cited

U.S. PATENT DOCUMENTS

| | | | | |
|---|---|---|---|---|
| 6,998,327 | B2* | 2/2006 | Danielson | H01L 21/6835 |
| | | | | 438/455 |
| 8,693,203 | B2* | 4/2014 | Rendek, Jr. | H01L 25/0657 |
| | | | | 428/209 |
| 8,867,219 | B2* | 10/2014 | Weatherspoon | H05K 1/036 |
| | | | | 428/209 |
| 9,691,698 | B2* | 6/2017 | Weatherspoon | H05K 3/32 |
| 11,164,817 | B2* | 11/2021 | Rubin | H01L 21/4853 |
| 11,516,910 | B1* | 11/2022 | Peng | H05K 3/06 |
| 2004/0097078 | A1* | 5/2004 | Danielson | H05K 3/4007 |
| | | | | 438/689 |
| 2012/0182701 | A1* | 7/2012 | Weatherspoon | H05K 3/32 |
| | | | | 257/E21.505 |
| 2019/0380210 | A1* | 12/2019 | Lin | H05K 3/4617 |
| 2022/0122898 | A1* | 4/2022 | Chen | H01L 21/6836 |
| 2022/0181242 | A1* | 6/2022 | Fan | H01L 23/49822 |

FOREIGN PATENT DOCUMENTS

| | | |
|---|---|---|
| TW | 202010061 | 3/2020 |
| TW | 202207396 | 2/2022 |
| TW | I781049 | 10/2022 |

* cited by examiner

CIRCUIT BOARD STRUCTURE AND MANUFACTURING METHOD THEREOF

CROSS-REFERENCE TO RELATED APPLICATION

This application claims the priority benefit of Taiwan application serial no. 111139981, filed on Oct. 21, 2022. The entirety of the above-mentioned patent application is hereby incorporated by reference herein and made a part of this specification.

BACKGROUND

Technical Field

The disclosure relates to a substrate structure and a manufacturing method thereof, and in particular, relates to a circuit board structure and a manufacturing method thereof.

Description of Related Art

Nowadays, electronic products exhibit multiple functions and stronger performance, and the number of I/Os required by the products also increases, so the pad size and the pad pitch of the products accordingly decrease. In addition, the above requirements also make it difficult to manufacture the surface treatment process. Especially for fine space products, since the surface treatment process is performed after the temporary carrier is removed, it is easy to cause bridge issues and electrical short circuits.

SUMMARY

The disclosure provides a circuit board structure exhibiting good structural reliability.

The disclosure further provides a manufacturing method of a circuit board structure configured to manufacture the abovementioned circuit board structure.

A circuit board structure provided by the disclosure includes a carrier, a thin film redistribution layer, a plurality of solder balls, and a surface treatment layer. The thin film redistribution layer is disposed on the carrier. The thin film redistribution layer includes a first dielectric layer, a plurality of pads, a first metal layer, a second dielectric layer, a second metal layer, and a third dielectric layer. The first dielectric layer has a top surface and a first surface opposite to each other and a plurality of first openings. The pads are located in the first openings, each of the pads has an upper surface, and the top surface is higher than the upper surface. The first metal layer is disposed on the first surface of the first dielectric layer. The second dielectric layer covers the first dielectric layer and the first metal layer and has a plurality of second openings exposing part of the first metal layer. The second metal layer is disposed on the second dielectric layer, extends into the second openings, and is electrically connected to the first metal layer. The third dielectric layer covers the second dielectric layer and the second metal layer and has a plurality of third openings exposing part of the second metal layer. A plurality of solder balls are disposed between the third dielectric layer of the thin film redistribution layer and the carrier and filled in the third openings. The solder balls are electrically connected to second metal layer of the thin film redistribution layer and the carrier. The surface treatment layer is disposed on the upper surfaces of the pads.

In an embodiment of the disclosure, a surface of the surface treatment layer is aligned with the top surface of the first dielectric layer.

In an embodiment of the disclosure, a surface of the surface treatment layer is lower than the top surface of the first dielectric layer.

In an embodiment of the disclosure, a surface of the surface treatment layer protrudes from the top surface of the first dielectric layer.

In an embodiment of the disclosure, each of the pads also has a second surface opposite to the upper surface, and the second surface is aligned with the first surface of the first dielectric layer.

In an embodiment of the disclosure, the first openings of the first dielectric layer expose part of the first metal layer to be defined as the pads.

In an embodiment of the disclosure, the circuit board structure further includes a patterned seed layer disposed on the first metal layer. Part of the patterned seed layer is located between the first metal layer and the first dielectric layer. The first openings of the first dielectric layer expose part of the patterned seed layer to be defined as the pads.

In an embodiment of the disclosure, the circuit board structure further includes an underfill filled between the third dielectric layer of the thin film redistribution layer and the carrier and covering the solder balls.

In an embodiment of the disclosure, each of the first dielectric layer, the second dielectric layer, and the third dielectric layer is a photosensitive dielectric layer.

A manufacturing method of a circuit board structure provided by the disclosure includes the following steps. A thin film redistribution layer is formed on a temporary carrier. The thin film redistribution layer includes a first dielectric layer, a metal layer, a first metal layer, a second dielectric layer, a second metal layer, and a third dielectric layer. The first dielectric layer and the metal layer are formed on the temporary carrier. The first dielectric layer has a plurality of first openings, and the metal layer is located in the first openings. A first surface of the first dielectric layer relatively away from the temporary carrier is aligned with a second surface of the metal layer relatively away from the temporary carrier. The first metal layer is formed on the first dielectric layer and the metal layer. The second dielectric layer covers the first dielectric layer and the first metal layer and has a plurality of second openings exposing part of the first metal layer. The second metal layer is disposed on the second dielectric layer, extends into the second openings, and is electrically connected to the first metal layer. The third dielectric layer covers the second dielectric layer and the second metal layer and has a plurality of third openings exposing part of the second metal layer. Thin film redistribution layer is assembled onto a carrier through a plurality of solder balls. The solder balls are disposed between the third dielectric layer and the carrier and filled in the third openings. The solder balls are electrically connected to the second metal layer and the carrier. After the thin film redistribution layer is assembled onto the carrier, the temporary carrier is removed to expose a top surface of the first dielectric layer. At least part of the metal layer is removed to form a plurality of pads. The top surface of the first dielectric layer is higher than an upper surface of each of the pads. A surface treatment layer is formed on the pads.

In an embodiment of the disclosure, the temporary carrier includes a glass substrate, a release film, and a seed layer. The release film is located between the glass substrate and the seed layer. The step of forming the thin film redistribution layer on the temporary carrier includes the following steps. The first dielectric layer is formed on the seed layer. The first openings of the first dielectric layer expose part of the seed layer. The metal layer is formed in the first openings of the first dielectric layer. A first patterned seed layer and the first metal layer thereon are formed on the first dielectric layer and the metal layer. The second dielectric layer is formed on the first dielectric layer. A second patterned seed layer and the second metal layer thereon are formed on the second dielectric layer and in the second openings. The third dielectric layer is formed on the second dielectric layer.

In an embodiment of the disclosure, the step of removing the temporary carrier and at least part of the metal layer includes the following steps. The glass substrate and the release film are removed. The seed layer and part of the metal layer are removed by etching.

In an embodiment of the disclosure, the metal layer is completely removed by etching to expose part of the first patterned seed layer to form the pads.

In an embodiment of the disclosure, the metal layer and part of the first patterned seed layer are completely removed by etching to expose part of the first metal layer to form the pads.

In an embodiment of the disclosure, a surface of the surface treatment layer is aligned with the top surface of the first dielectric layer.

In an embodiment of the disclosure, a surface of the surface treatment layer is lower than the top surface of the first dielectric layer.

In an embodiment of the disclosure, a surface of the surface treatment layer protrudes from the top surface of the first dielectric layer.

In an embodiment of the disclosure, the manufacturing method of the circuit board structure further includes the following step. Before the temporary carrier is removed, an underfill is filled between the third dielectric layer of the thin film redistribution layer and the carrier and covers the solder balls.

In an embodiment of the disclosure, each of the first dielectric layer, the second dielectric layer, and the third dielectric layer is a photosensitive dielectric layer.

Based on the above, in the design of the circuit board structure provided by the disclosure, the top surface of the first dielectric layer is higher than the upper surface of each of the pads. That is, the first dielectric layer may be regarded as a dam, which can effectively prevent the surface treatment layer subsequently formed on the pads from being electrically short-circuited due to the bridge issue caused by the fine space. Therefore, the circuit board structure provided by the disclosure may exhibit good structural reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
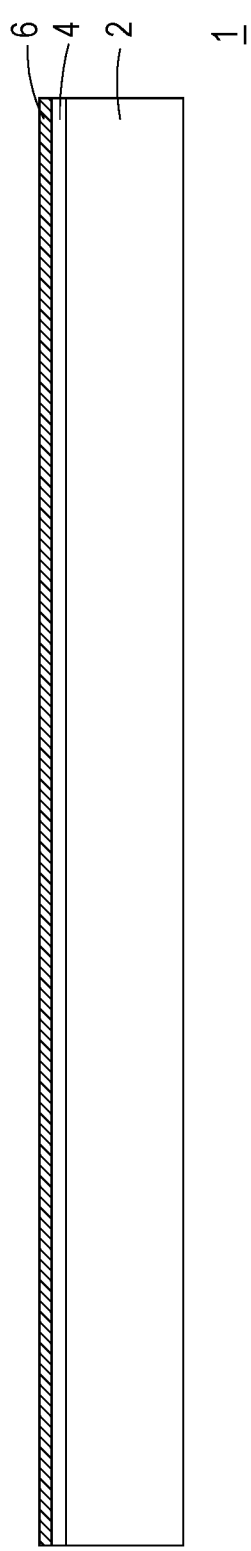
FIG. 1A to FIG. 1Q are cross-sectional schematic views of a manufacturing method of a circuit board structure according to an embodiment of the disclosure.
Figure 1B:
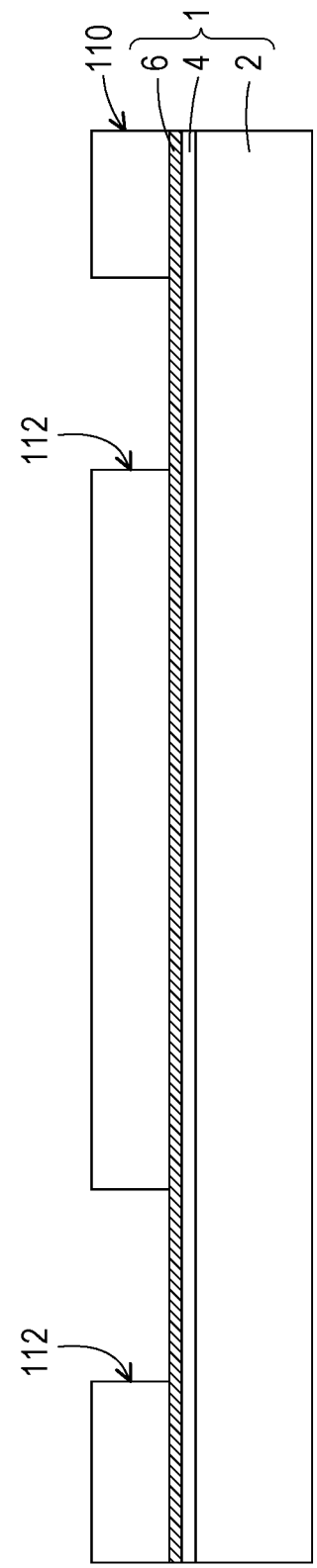
Figure 1C:
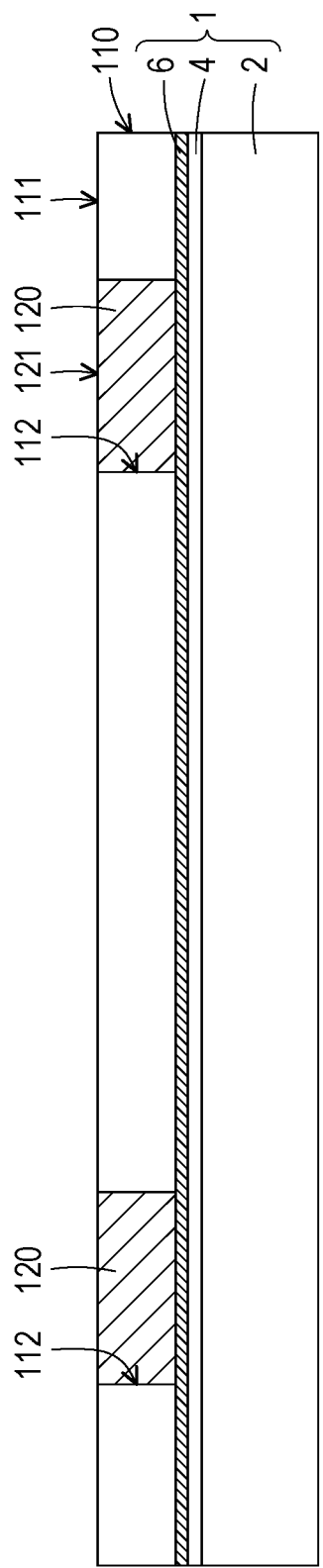
Figure 1D:
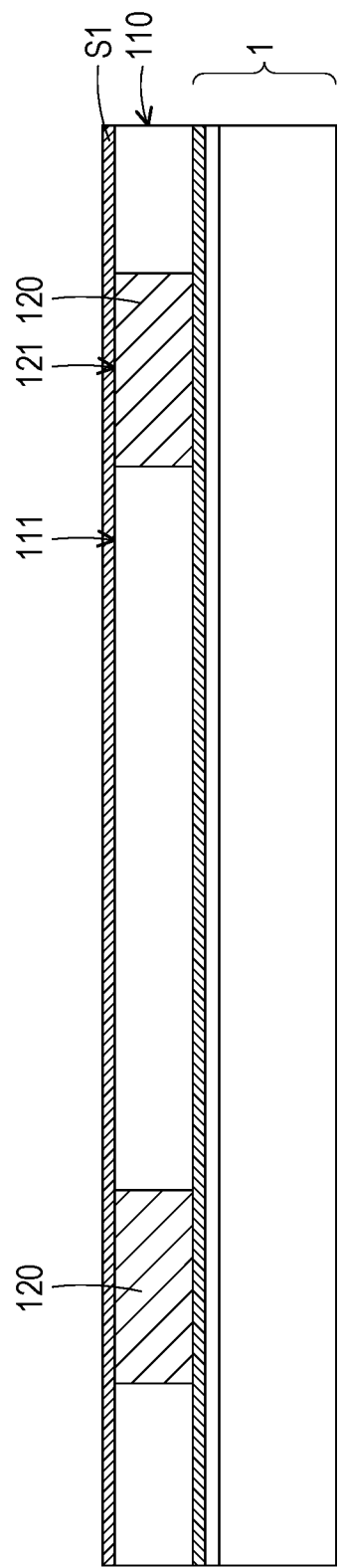
Figure 1E:
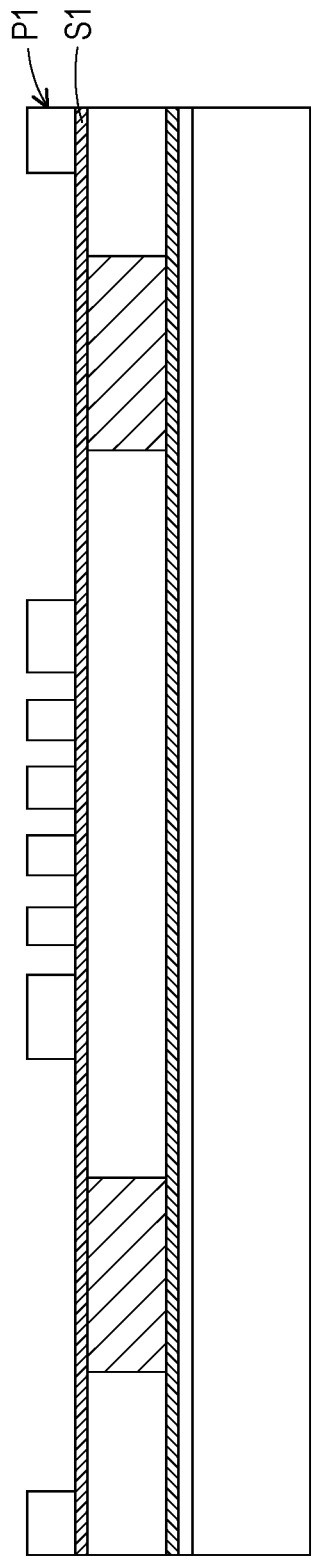
Figure 1F:
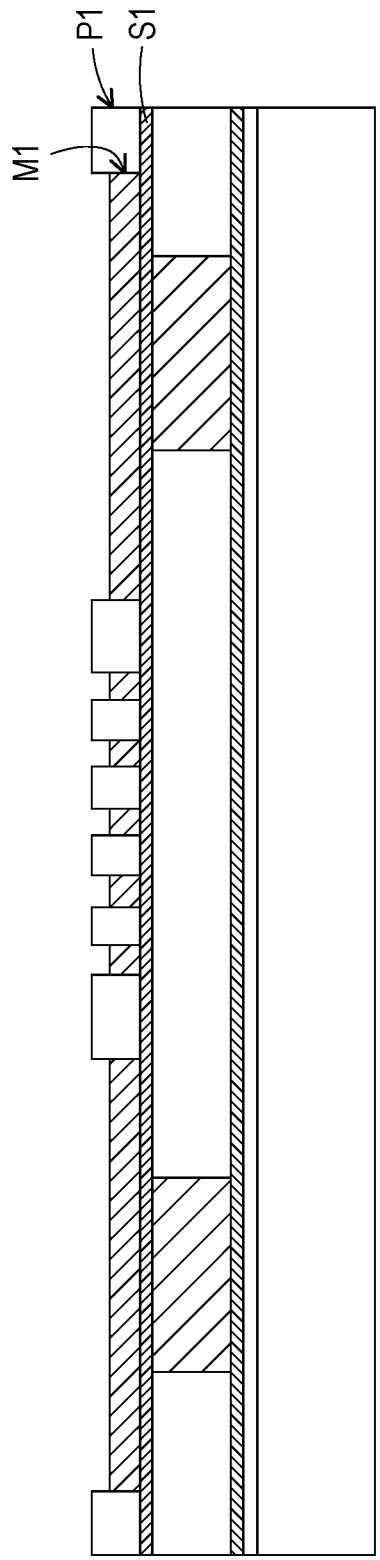
Figure 1G:
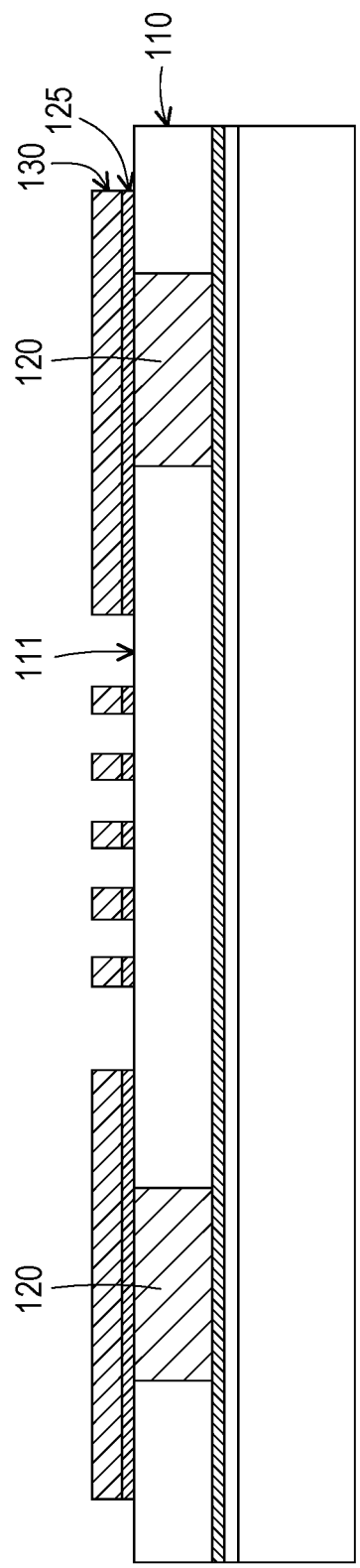
Figure 1H:
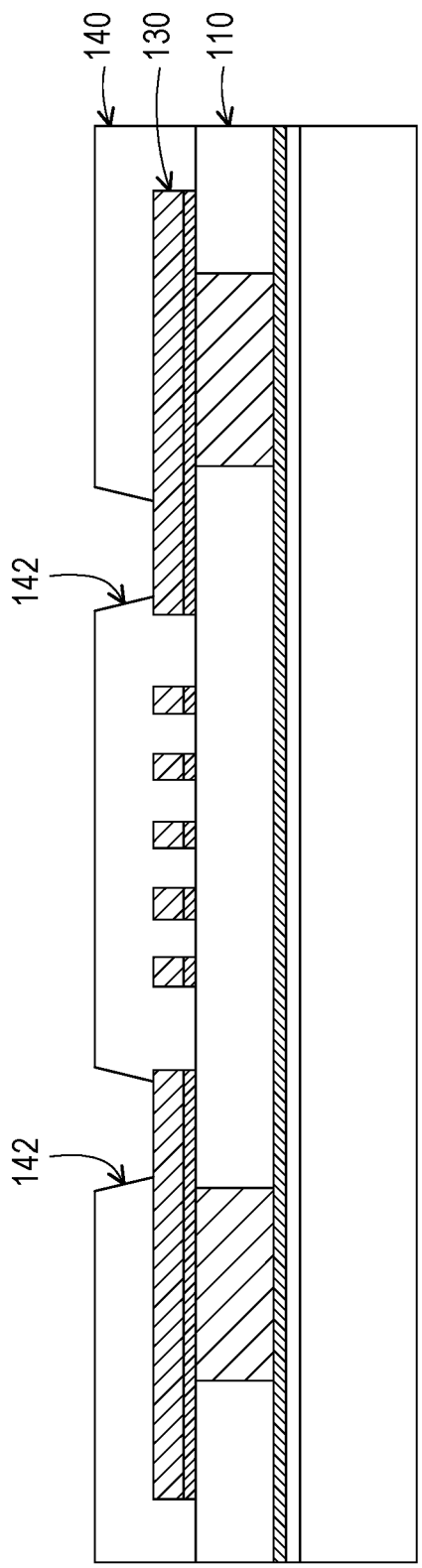
Figure 1I:
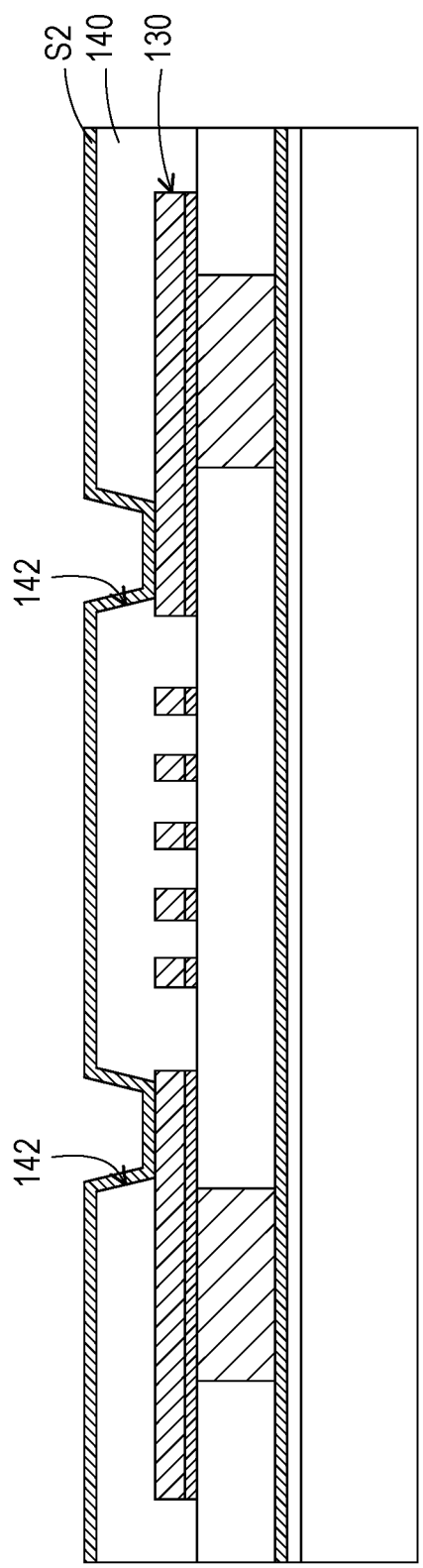
Figure 1J:
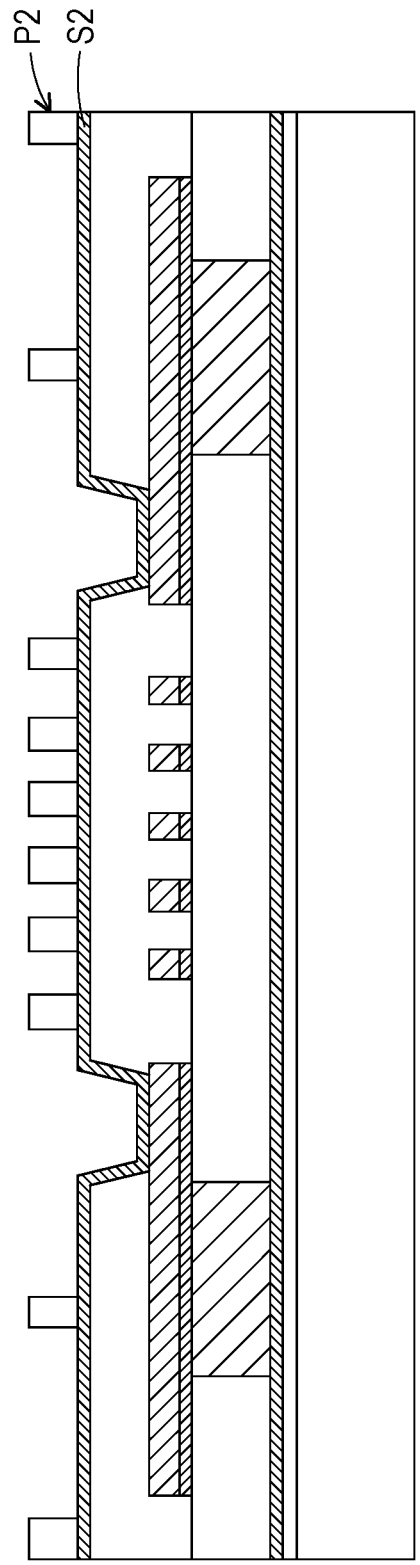
Figure 1K:
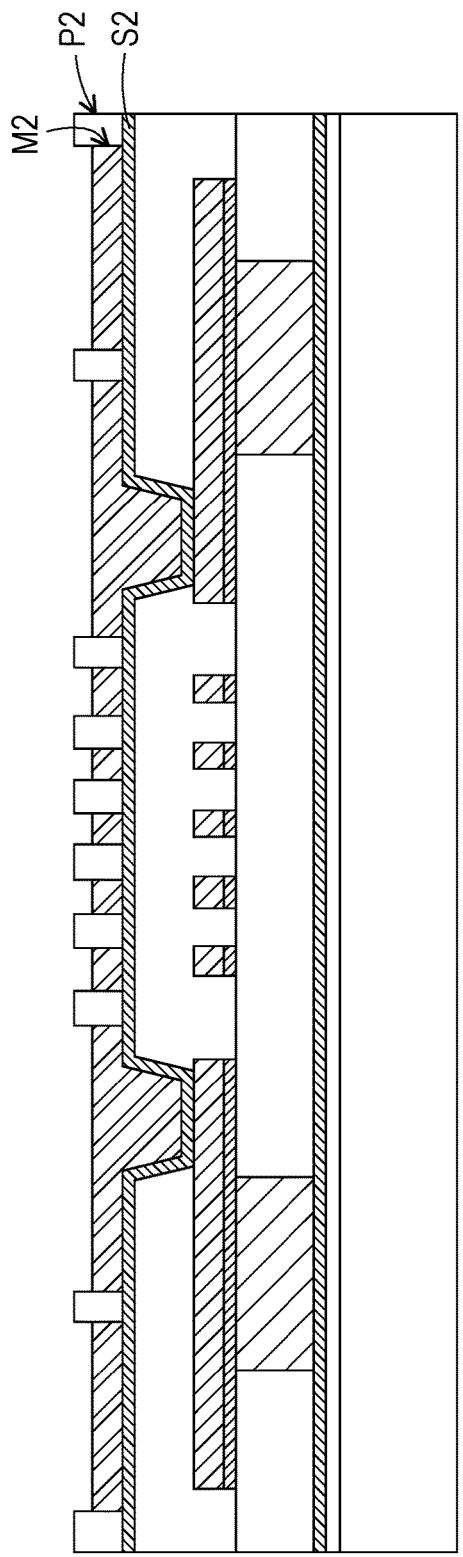
Figure 1L:
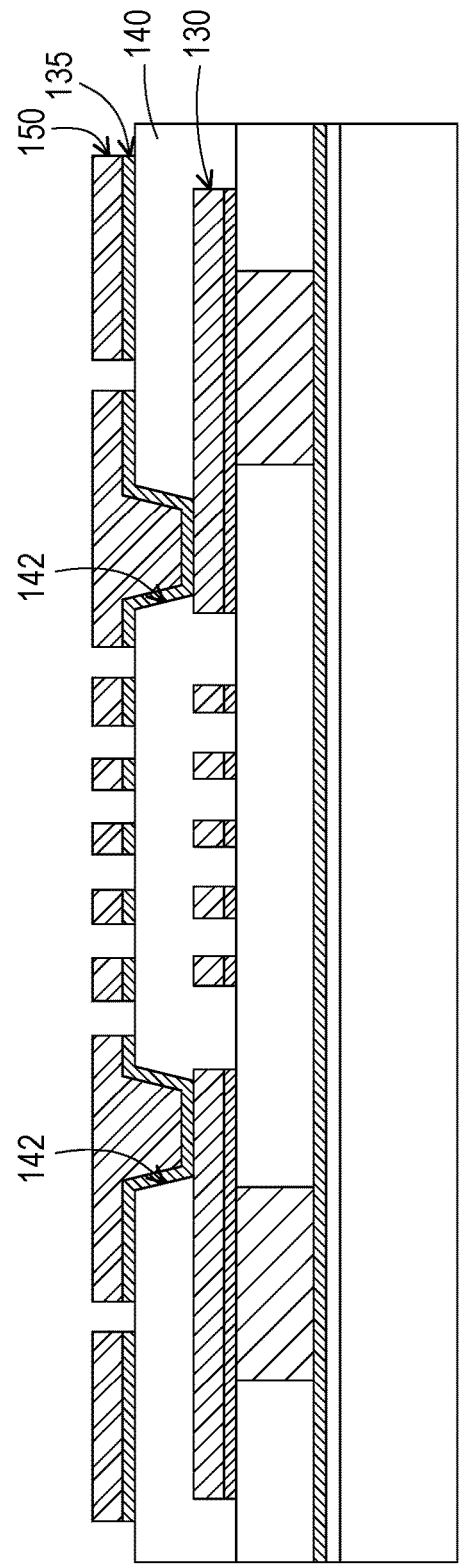
Figure 1M:
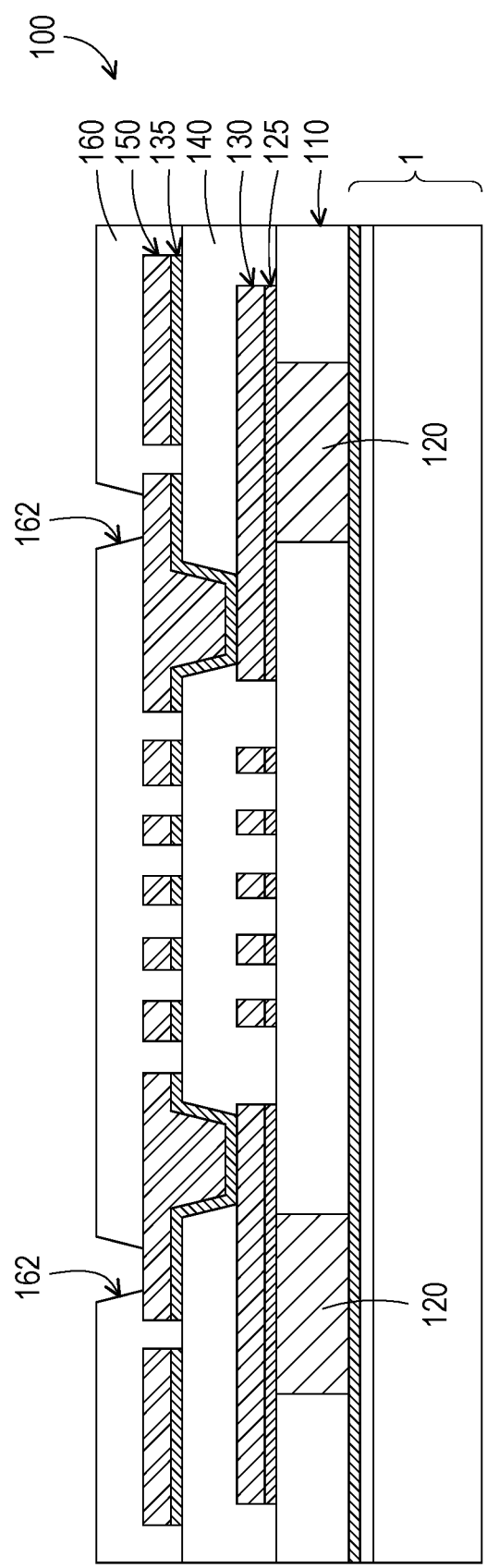
Figure 1N:
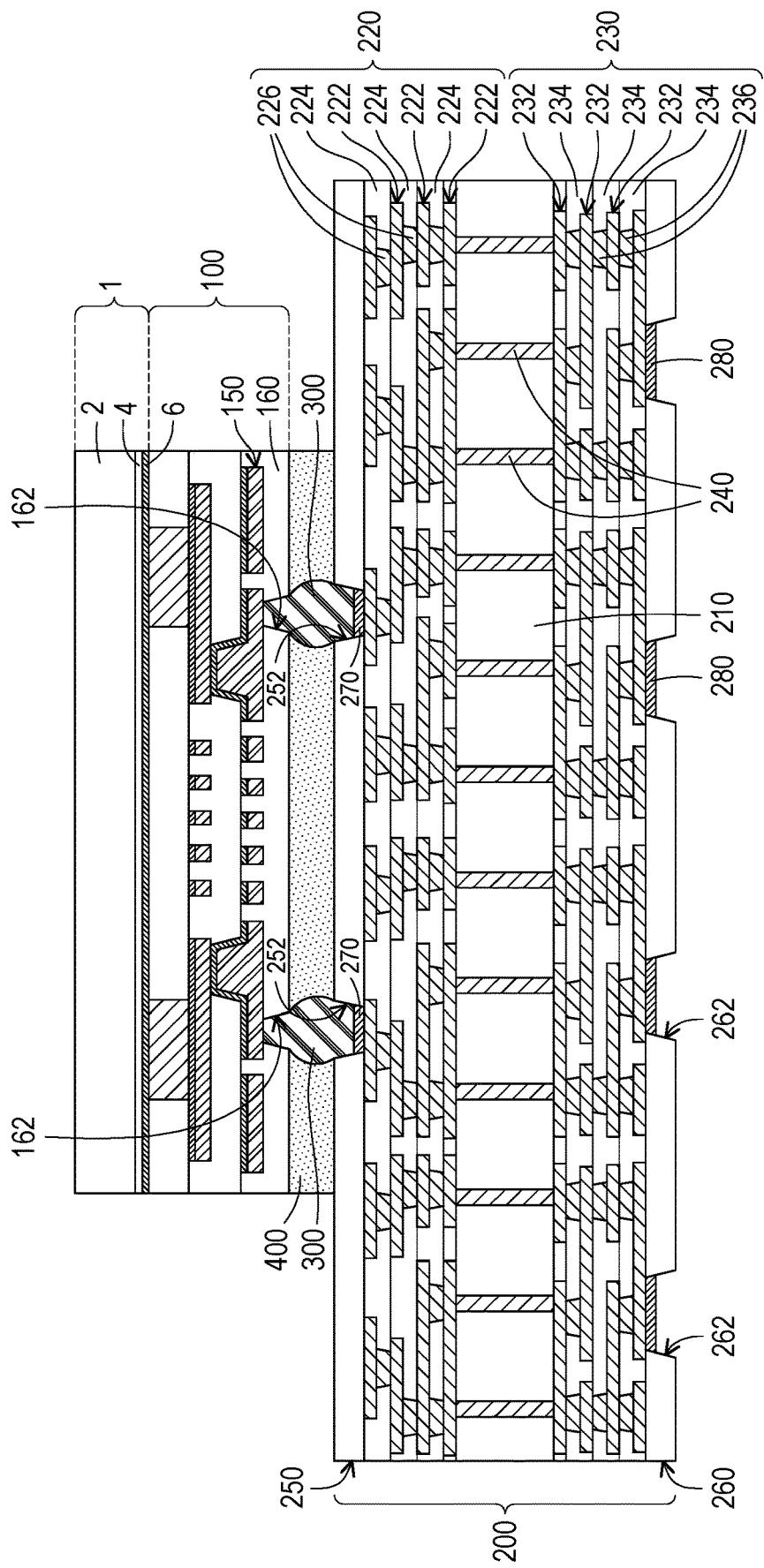
Figure 10:
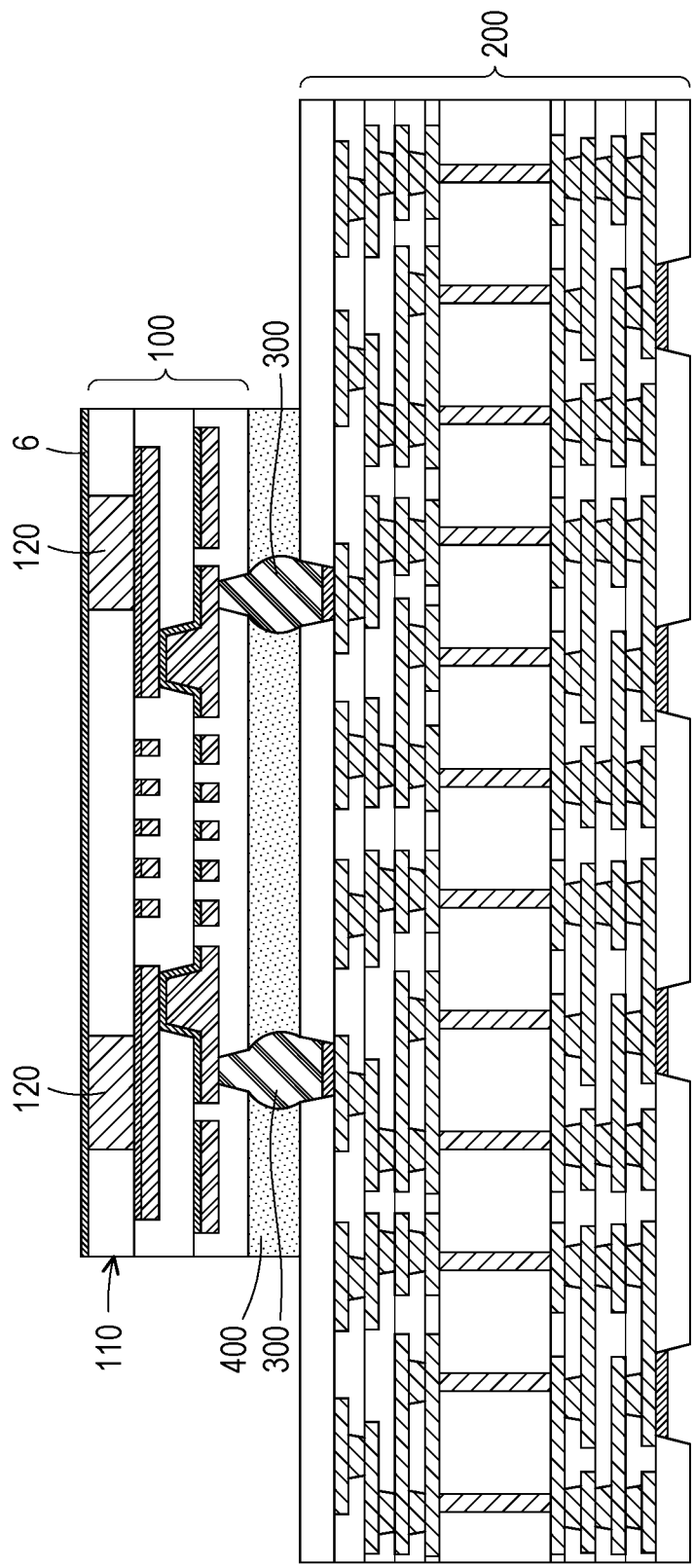
Figure 1P:
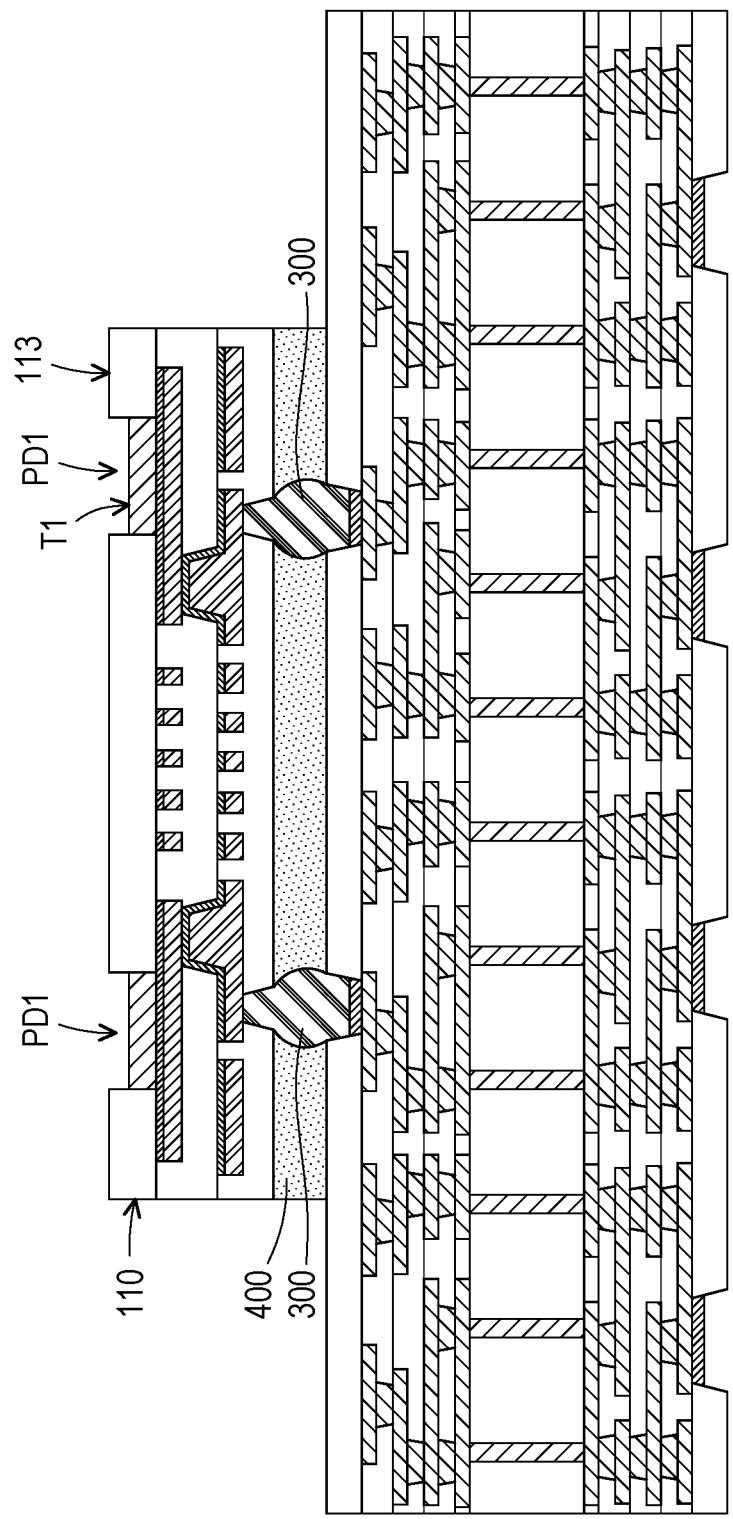
Figure 1Q:
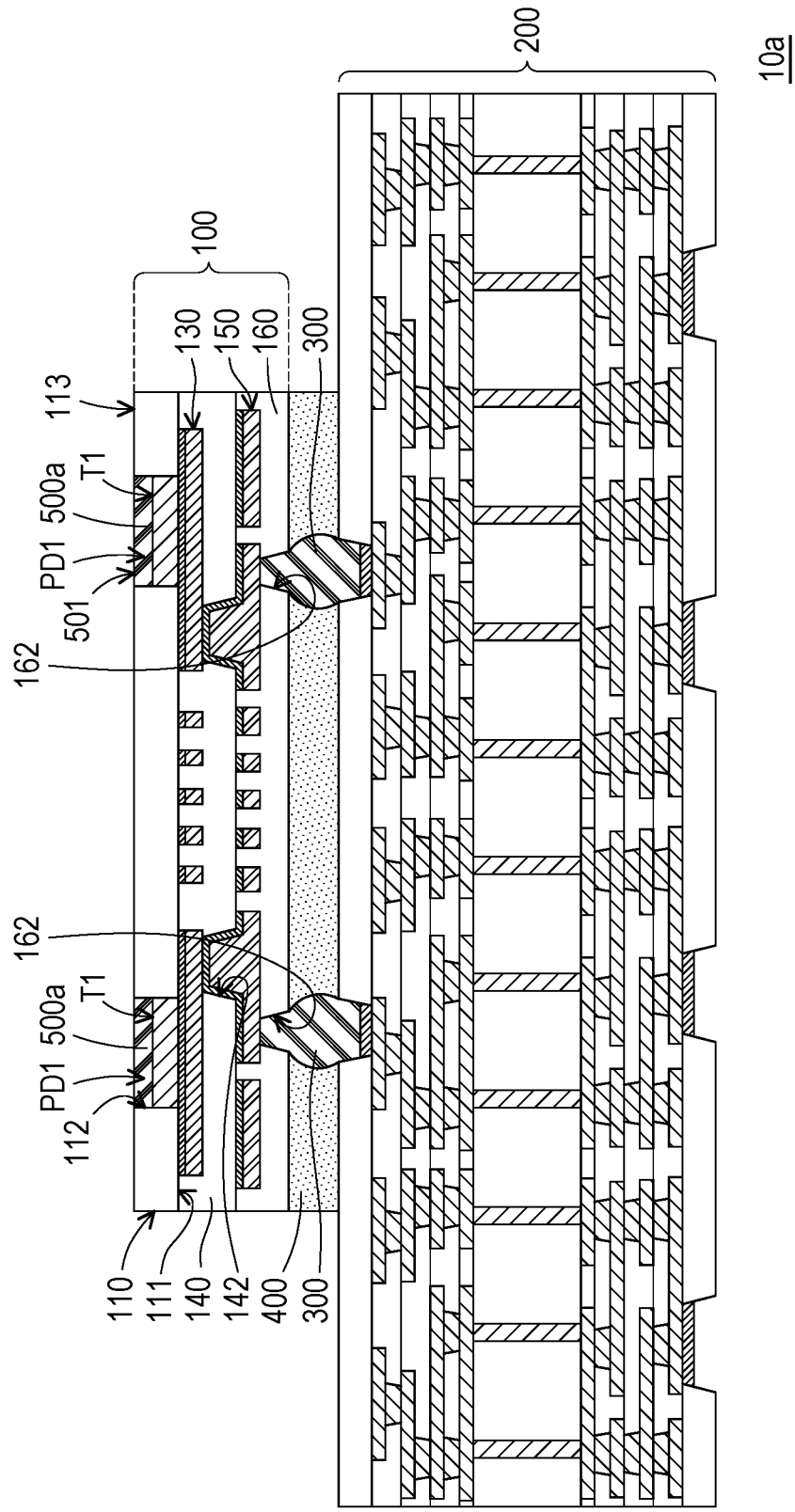

FIG. 1A to FIG. 1Q are cross-sectional schematic views of a manufacturing method of a circuit board structure according to an embodiment of the disclosure. Regarding a manufacturing method of a circuit board provided by this embodiment, first, with reference to FIG. 1A, a temporary carrier 1 is provided. The temporary carrier 1 includes a glass substrate 2, a release film 4, and a seed layer 6, and the release film 4 is located between the glass substrate 2 and the seed layer 6. The material of the seed layer 6 is, for example, titanium, but not limited thereto.

Next, with reference to FIG. 1B, a first dielectric layer 110 is formed on the seed layer 6. The first dielectric layer 110 has a plurality of first openings 112, and the first openings 112 expose part of the seed layer 6. Herein, the method for forming the first dielectric layer 110 is, for example, to form a dielectric layer on the seed layer 6 by coating. Next, laser drilling is performed on the dielectric layer to form the first dielectric layer 110 having the first openings 112, but not limited thereto. The first dielectric layer 110 may be, for example, a photosensitive dielectric layer.

Next, with reference to FIG. 1C, a plating process is performed through the seed layer 6 to form a metal layer 120 in the first openings 112 of the first dielectric layer 110, that is, the metal layer 120 is located in the first openings 112. So far, the first dielectric layer 110 and the metal layer 120 are formed on the temporary carrier 1, and a first surface 111 of the first dielectric layer 110 relatively away from the temporary carrier 1 is aligned with a second surface 121 of the metal layer 120 relatively away from the temporary carrier 1. In this embodiment, the first dielectric layer 110 is formed on the temporary carrier 1 first, and then the metal layer 120 is formed by plating, so that the structure flatness can be improved, the reliability abnormality can be avoided, and the electrical properties of the product can be improved.

Next, with reference to FIG. 1D, a seed layer S1 is formed on the first dielectric layer 110 and the metal layer 120 by sputtering. The seed layer S1 completely covers the first surface 111 of the first dielectric layer 110 and the second surface 121 of the metal layer 120. The material of the seed layer S1 is, for example, titanium, but not limited thereto.

Next, with reference to FIG. 1E, a patterned photoresist layer P1 is formed on the seed layer S1, and the patterned photoresist layer P1 exposes part of the seed layer S1.

Next, with reference to FIG. 1F, a plating process is performed on the seed layer S1 to form a metal layer M1 on the seed layer S1 exposed by the patterned photoresist layer P1.

Next, with reference to FIG. 1F and FIG. 1G together, the patterned photoresist layer P1 and the seed layer S1 located thereunder are removed by stripping and etching to form a first patterned seed layer 125 and a first metal layer 130 thereon on the first dielectric layer 110 and the metal layer 120. The first patterned seed layer 125 and the first metal layer 130 thereon expose part of the first surface 111 of the first dielectric layer 110, and the first patterned seed layer 125 and the first metal layer 130 thereon are defined as a horizontal patterned circuit layer.

Next, with reference to FIG. 1H, a second dielectric layer 140 is formed on the first dielectric layer 110. The second dielectric layer 140 covers the first dielectric layer 110 and the first metal layer 130 and has a plurality of second openings 142 exposing part of the first metal layer 130. Herein, the method for forming the second dielectric layer 140 is, for example, to form a dielectric layer on the first dielectric layer 110 by coating. Next, laser drilling is performed on the dielectric layer to form the second dielectric layer 140 having the second openings 142, but not limited thereto. The second dielectric layer 140 may be, for example, a photosensitive dielectric layer.

Next, with reference to FIG. 1I, a seed layer S2 is formed on the second dielectric layer 140 and in the second openings 142 by sputtering. The seed layer S2 directly contacts the first metal layer 130 exposed by the second openings 142. The material of the seed layer S2 is, for example, titanium, but not limited thereto.

Next, with reference to FIG. 1J, a patterned photoresist layer P2 is formed on the seed layer S2, and the patterned photoresist layer P2 exposes part of the seed layer S2.

Next, with reference to FIG. 1K, a plating process is performed on the seed layer S2 to form a metal layer M2 on the seed layer S2 exposed by the patterned photoresist layer P2.

Next, with reference to FIG. 1L, the patterned photoresist layer P2 and the seed layer S2 located thereunder are removed by stripping and etching to form a second patterned seed layer 135 and a second metal layer 150 thereon on the second dielectric layer 140 and in the second openings 142. The second patterned seed layer 135 and the second metal layer 150 thereon are disposed on the second dielectric layer 140 and extend into the second openings 142 to be electrically connected to the first metal layer 130. The second patterned seed layer 135 and the second metal layer 150 thereon are expose part of the second dielectric layer 140. The second patterned seed layer 135 on the second dielectric layer 140 and the second metal layer 150 thereon may be defined as a horizontal patterned circuit layer. The second patterned seed layer 135 on the second dielectric layer 140 in the second openings 142 and the second metal layer 150 thereon may be defined as a vertical conductive via, which can connect the upper and lower horizontal patterned circuit layers.

Next, with reference to FIG. 1M, a third dielectric layer 160 is formed on the second dielectric layer 140. The third dielectric layer 160 covers the second dielectric layer 140 and the second metal layer 150 and has a plurality of third openings 162 exposing part of the second metal layer 150. The third dielectric layer 160 may be, for example, a photosensitive dielectric layer. A thin film redistribution layer 100 is formed on the temporary carrier 1 so far. The thin film redistribution layer 100 includes the first dielectric layer 110, the metal layer 120, the first patterned seed layer 125, the first metal layer 130, the second dielectric layer 140, the second patterned seed layer 135, the second metal layer 150, and the third dielectric layer 160.

Next, with reference to FIG. 1N, the temporary carrier 1 and the thin film redistribution layer 100 formed thereon are turned over so that the temporary carrier 1 is on top and the thin film redistribution layer 100 is on the bottom. Next, the thin film redistribution layer 100 is assembled onto a carrier 200 through a plurality of solder balls 300. The carrier 200 includes a core layer 210, a first build-up circuit layer 220, a second build-up circuit layer 230, a plurality of conductive vias 240, a first solder mask layer 250, a second solder mask layer 260, a first surface treatment layer 270, and a second surface treatment layer 280. The first build-up circuit layer 220 and the second build-up circuit layer 230 are located on opposite sides of the core layer 210 and respectively have multi-layer circuit layers 222 and 232, multi-layer dielectric layers 224 and 234, and a plurality of conductive holes 226 and 236. The circuit layers 222 and 232 are alternately arranged with the dielectric layers 224 and 234, and two adjacent circuit layers 222 and 232 are electrically connected through the corresponding conductive holes 226 and 236. The conductive vias 240 penetrate through the core layer 210 and are electrically connected to the circuit layer 222 of the first build-up circuit layer 220 and the circuit layer 232 of the second build-up circuit layer 230. The first solder mask layer 250 and the second solder mask layer 260 are respectively disposed on the first build-up circuit layer 220 and the second build-up circuit layer 230 and respectively have solder mask openings 252 and 262 exposing the outermost circuit layers 222 and 232. The first surface treatment layer 270 and the second surface treatment layer 280 are respectively disposed on the circuit layers 222 and 232 exposed by the solder mask openings 252 and 262. The solder balls 300 are located between the third dielectric layer 160 and the first solder mask layer 250 of the carrier 200 and are filled in the third openings 162 and the solder mask openings 252. The solder balls 300 are electrically connected to the second metal layer 150 and the first surface treatment layer 270, so that the thin film redistribution layer 100 is electrically connected to the carrier 200.

Next, with reference to FIG. 1N again, an underfill 400 is filled between the third dielectric layer 160 of the thin film redistribution layer 100 and the first solder mask layer 250 of the carrier 200 and covers the solder balls 300.

Next, with reference to FIG. 1N and FIG. 1O, after the thin film redistribution layer 100 is assembled onto the carrier 200, the glass substrate 2 and the release film 4 are removed. For instance, the release film 4 and the seed layer 6 are delaminated by applying external energy (e.g., heat and/or pressure, etc.) to the release film 4 located between the glass substrate 2 and the seed layer 6. Alternatively, other suitable processes, such as mechanical removal, etching, grinding, etc., may be used to remove the glass substrate 2 and the release film 4.

After that, with reference to FIG. 1O and FIG. 1P together, the seed layer 6 and part of the metal layer 120 are removed by etching to form a plurality of pads PD1. Here, the temporary carrier 1 is removed, and a top surface 113 of the first dielectric layer 110 is exposed. The top surface 113 of the first dielectric layer 110 is higher than an upper surface T1 of each of the pads PD1.

Finally, with reference to FIG. 1Q, a surface treatment layer 500a is formed on the pads PD1. Here, a surface 501 of the surface treatment layer 500a is substantially aligned with the top surface 113 of the first dielectric layer 110. The material of the surface treatment layer 500a is, for example, nickel-gold electroplating, tin-silver electroplating, nickel-palladium-gold, tin-electrode, or palladium-gold, but not limited thereto.

In short, in this embodiment, after the temporary carrier 1 is removed, the metal layer 120 is etched first, and the surface treatment layer 500a is then manufactured. Therefore, when the surface treatment layer 500a is formed, the first dielectric layer 110 may act as a dam to reduce/avoid electrical short circuits which are generated due to the bridge issue. Manufacturing of a circuit board structure 10a is completed so far. In an embodiment, the circuit board structure 10a is, for example, a test probe card, but not limited thereto.

Structurally, with reference to FIG. 1Q again, the circuit board structure 10a includes the thin film redistribution layer 100, the carrier 200, the solder balls 300, and the surface treatment layer 500a. The thin film redistribution layer 100 is disposed on the carrier 200 and includes the first dielectric layer 110, the pads PD1, the first metal layer 130, the second dielectric layer 140, the second metal layer 150, and the third dielectric layer 160. The first dielectric layer 110 has the first surface 111 and the top surface 113 opposite to each other and the first openings 112. The pads PD1 are located in the first openings 112, each of the pads PD1 has the upper surface T1, and the top surface 113 is higher than the upper surface T1. The first metal layer 130 is disposed on the first surface 111 of the first dielectric layer 110. The first metal layer 130 is a horizontal patterned circuit layer, which can be electrically connected to the vertical pads PD1. The second dielectric layer 140 covers the first dielectric layer 110 and the first metal layer 130 and has a plurality of second openings 142 exposing part of the first metal layer 130. The second metal layer 150 is disposed on the second dielectric layer 140, extends into the second openings 142, and is electrically connected to the first metal layer 130. The third dielectric layer 160 covers the second dielectric layer 140 and the second metal layer 150 and has a plurality of third openings 162 exposing part of the second metal layer 150. The solder balls 300 are disposed between the third dielectric layer 160 of the thin film redistribution layer 100 and the carrier 200 and filled in the third openings 162. The solder balls 300 are electrically connected to second metal layer 150 of the thin film redistribution layer 100 and the carrier 200. The surface treatment layer 500a is disposed on the upper surfaces T1 of the pads PD1, and the surface 501 of the surface treatment layer 500a is aligned with the top surface 113 of the first dielectric layer 110. Further, in this embodiment, the circuit board structure 10a also includes the underfill 400, and the underfill 400 is filled between the third dielectric layer 160 of the thin film redistribution layer 100 and the carrier 200 and covers the solder balls 300.

In short, in the design of the circuit board structure 10a of this embodiment, the top surface 113 of the first dielectric layer 110 is higher than the upper surface T1 of each of the pads PD1. That is, the first dielectric layer 110 may be regarded as a dam, which can effectively prevent the surface treatment layer 500a subsequently formed on the pads PD1 from being electrically short-circuited due to the bridge issue caused by the fine space. Therefore, the circuit board structure 10a of this embodiment may exhibit good structural reliability.

Other embodiments are described for illustration in the following. It should be noted that the reference numerals and a part of the contents in the previous embodiments are used in the following embodiments, in which identical reference numerals indicate identical or similar components, and repeated description of the same technical content is omitted. Please refer to the description of the previous embodiments for the omitted content, which will not be repeated hereinafter.

Figure 2:
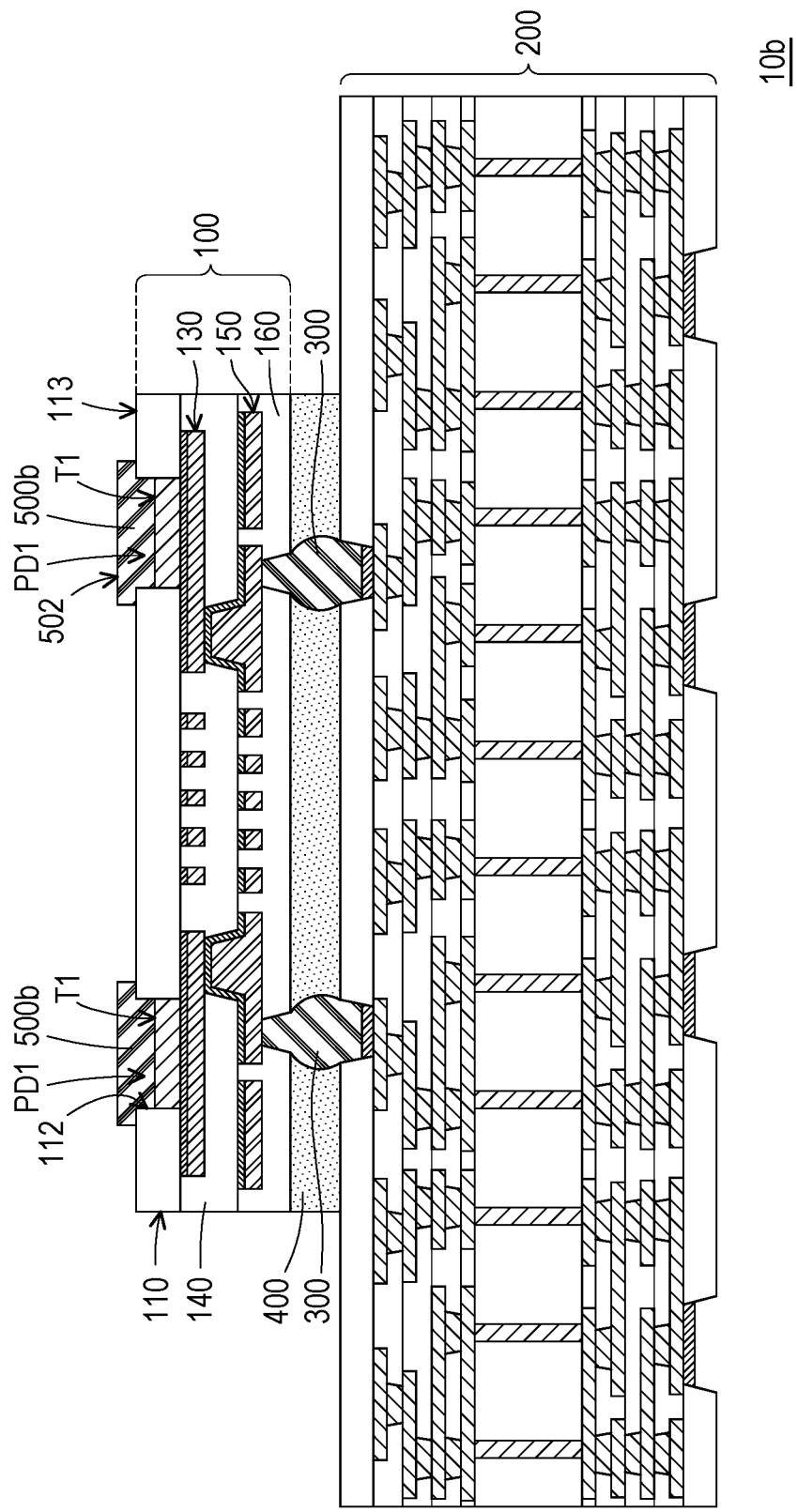
FIG. 2 is a cross-sectional schematic view of a circuit board structure according to an embodiment of the disclosure.

FIG. 2 is a cross-sectional schematic view of a circuit board structure according to an embodiment of the disclosure. With reference to FIG. 1Q and FIG. 2 together, a circuit board structure 10b of this embodiment is similar to the circuit board structure 10a in FIG. 1Q, but the main difference therebetween is that: in this embodiment, a surface 502 of a surface treatment layer 500b protrudes from the top surface 113 of the first dielectric layer 110. In this way, the coverage area of the surface treatment layer 500b may be increased to prevent the first dielectric layer 110 from being damaged.

Figure 3:
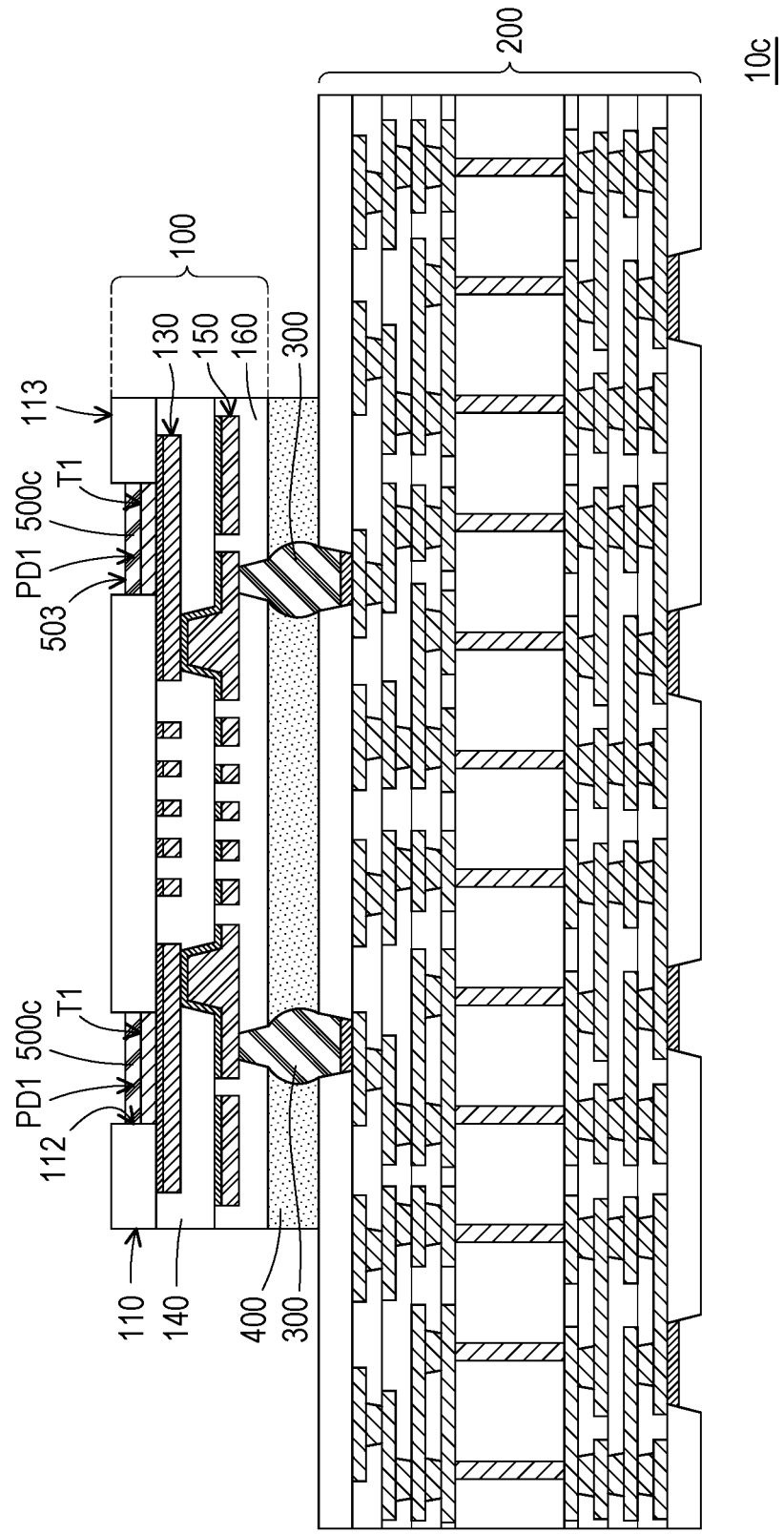
FIG. 3 is a cross-sectional schematic view of a circuit board structure according to another embodiment of the disclosure.

FIG. 3 is a cross-sectional schematic view of a circuit board structure according to another embodiment of the disclosure. With reference to FIG. 1Q and FIG. 3 together, a circuit board structure 10c of this embodiment is similar to the circuit board structure 10a in FIG. 1Q, but the main difference therebetween is that: in this embodiment, a surface 503 of the surface treatment layer 500c is lower than the top surface 113 of the first dielectric layer 110, so that the occurrence of pin slip may be reduced.

Figure 4:
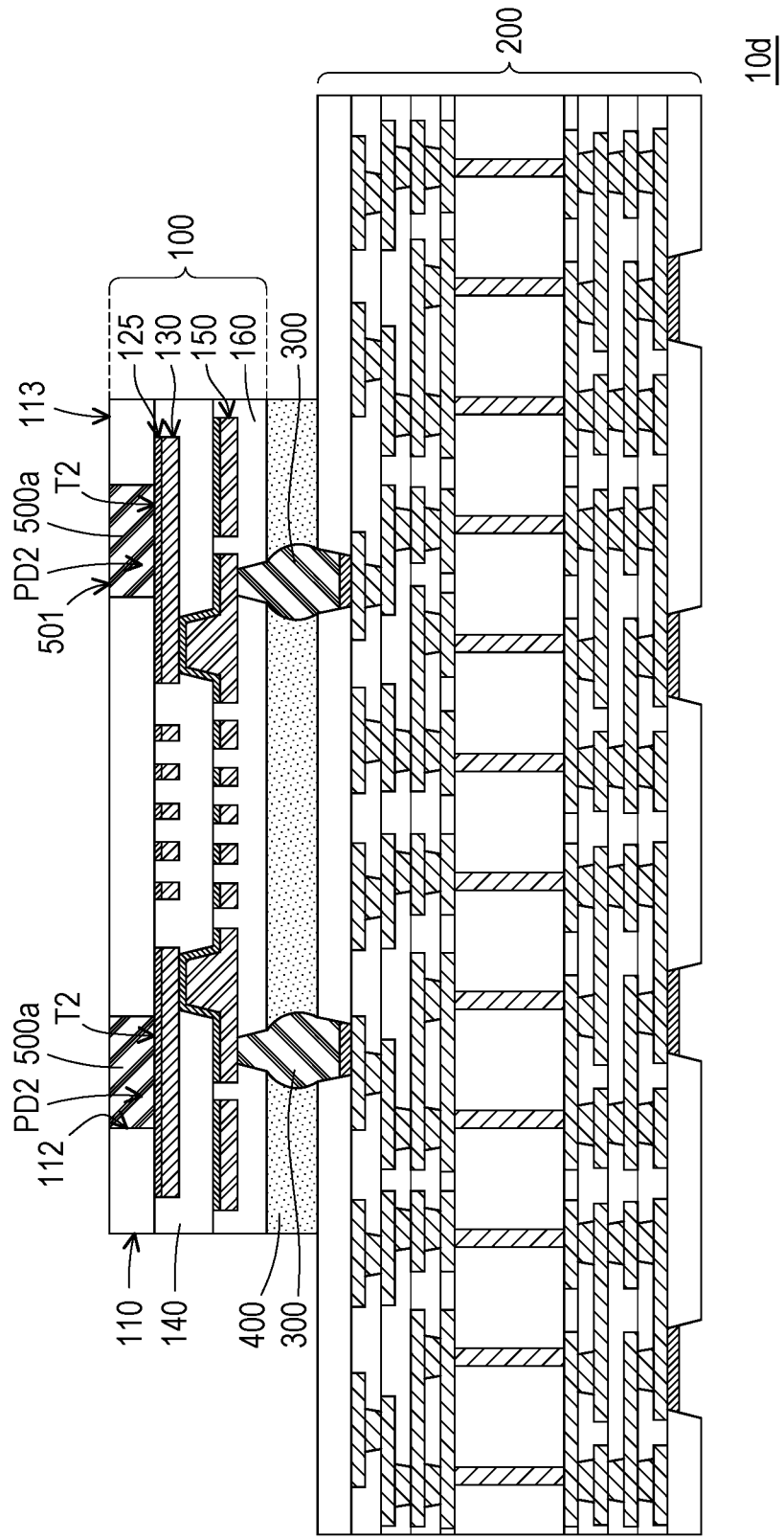
FIG. 4 is a cross-sectional schematic view of a circuit board structure according to another embodiment of the disclosure.

FIG. 4 is a cross-sectional schematic view of a circuit board structure according to another embodiment of the disclosure. With reference to FIG. 1Q and FIG. 4 together, a circuit board structure 10d of this embodiment is similar to the circuit board structure 10a in FIG. 1Q, but the main difference therebetween is that: in the step of FIG. 1O, the metal layer 120 is completely removed by etching to expose part of the first patterned seed layer 125 to form the pads PD2. In this etching step, the first patterned seed layer 125 may act as an etch stop layer for etching the metal layer 120. The top surface 113 of the first dielectric layer 110 is higher than an upper surface T2 of each of the pads PD2. The surface 501 of the surface treatment layer 500a is substantially aligned with the top surface 113 of the first dielectric layer 110. Since the metal layer 120 is completely removed, the accommodating space of the surface treatment layer 500a is increased, so the surface wear resistance is improved.

Figure 5:
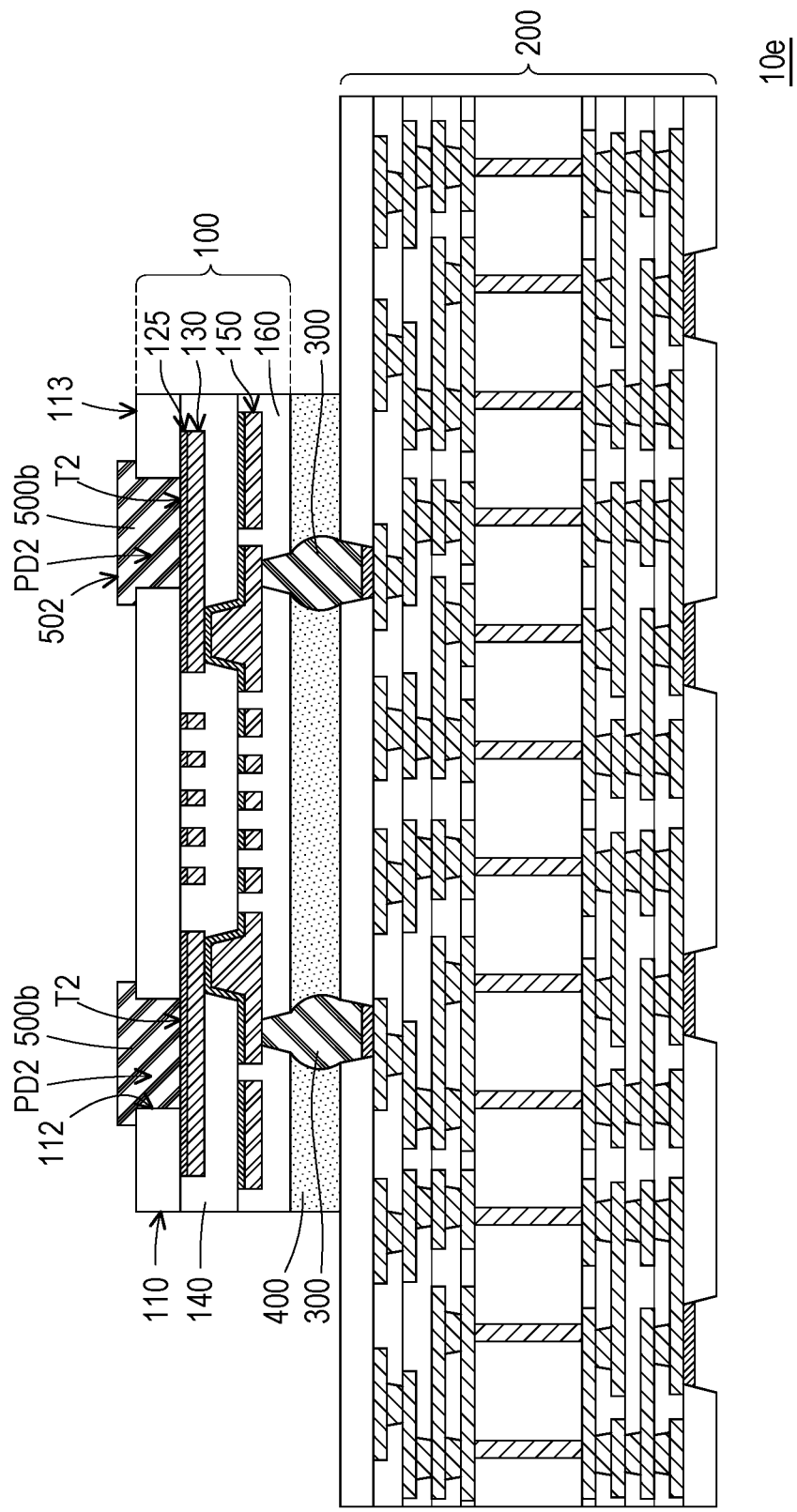
FIG. 5 is a cross-sectional schematic view of a circuit board structure according to another embodiment of the disclosure.

FIG. 5 is a cross-sectional schematic view of a circuit board structure according to another embodiment of the disclosure. With reference to FIG. 4 and FIG. 5 together, a circuit board structure 10e of this embodiment is similar to the circuit board structure 10d in FIG. 4, but the main difference therebetween is that: In this embodiment, the surface 502 of the surface treatment layer 500b protrudes from the top surface 113 of the first dielectric layer 110. In this way, the coverage area of the surface treatment layer 500b may be increased to prevent the first dielectric layer 110 from being damaged.

Figure 6:
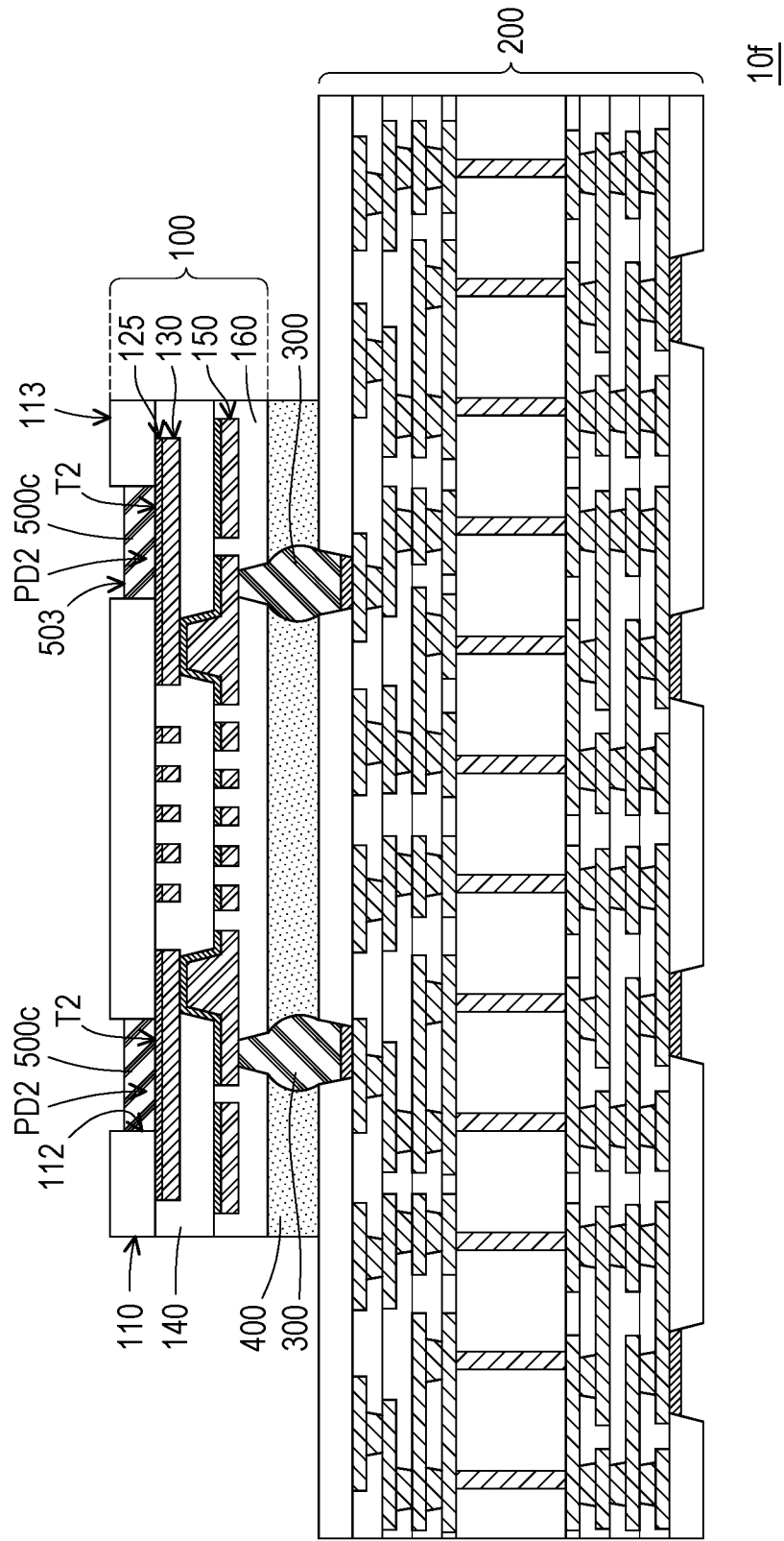
FIG. 6 is a cross-sectional schematic view of a circuit board structure according to another embodiment of the disclosure.

FIG. 6 is a cross-sectional schematic view of a circuit board structure according to another embodiment of the disclosure. With reference to FIG. 4 and FIG. 6 together, a circuit board structure 10f of this embodiment is similar to the circuit board structure 10f in FIG. 4, but the main difference therebetween is that: in this embodiment, the surface 503 of the surface treatment layer 500c is lower than the top surface 113 of the first dielectric layer 110, so that the occurrence of pin slip may be reduced.

Figure 7:
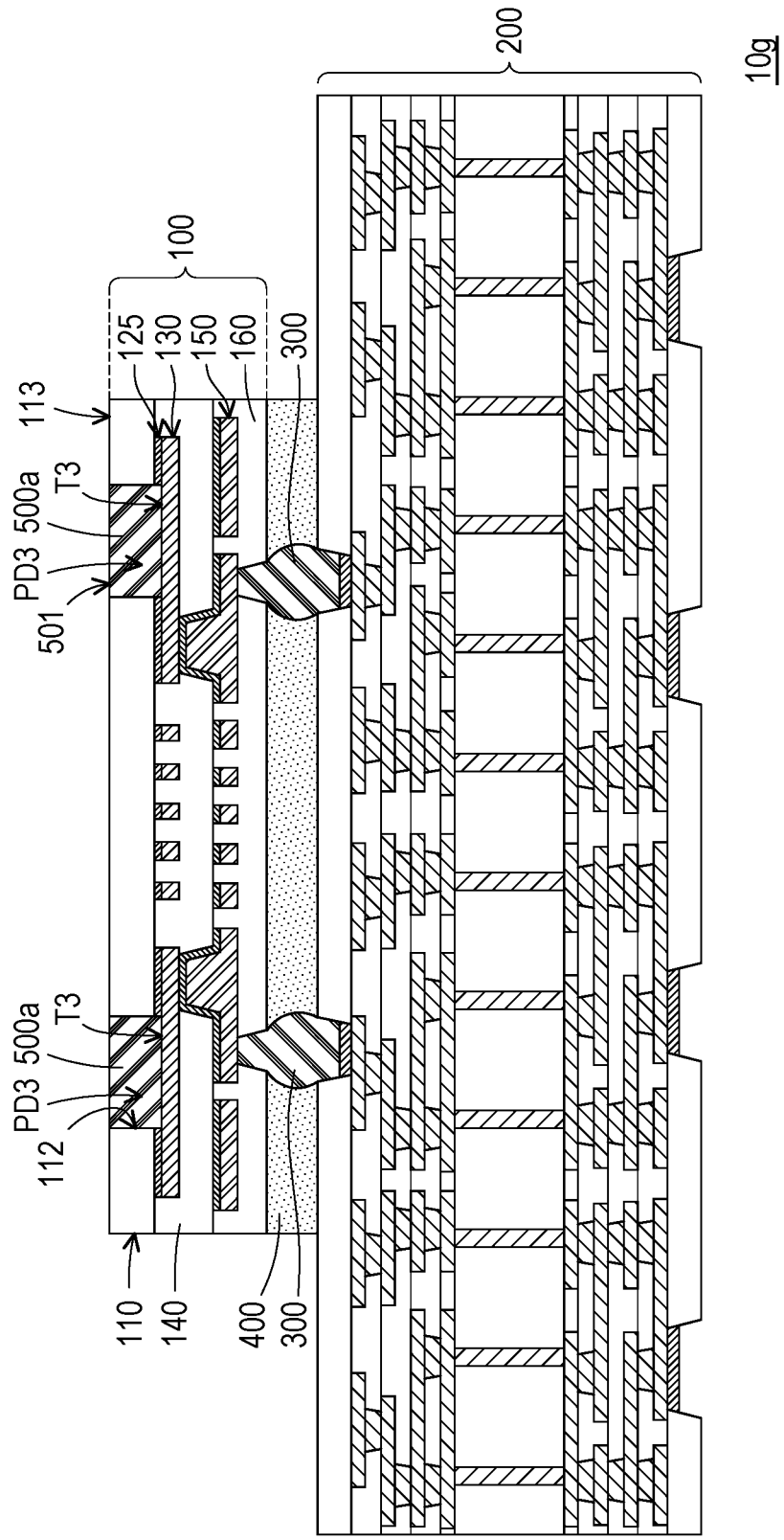
FIG. 7 is a cross-sectional schematic view of a circuit board structure according to another embodiment of the disclosure.

FIG. 7 is a cross-sectional schematic view of a circuit board structure according to another embodiment of the disclosure. With reference to FIG. 1Q and FIG. 7 together, a circuit board structure 10g of this embodiment is similar to the circuit board structure 10a in FIG. 1Q, but the main difference therebetween is that: in the step of FIG. 1O, the metal layer 120 and part of the first patterned seed layer 125 are completely removed by etching to expose part of the first metal layer 130 to form the pads PD3. In this etching step, the first patterned seed layer 125 and the first metal layer 130 may respectively act as etch stop layers for etching the metal layer 120 and etching the first patterned seed layer 125. The top surface 113 of the first dielectric layer 110 is higher than an upper surface T3 of each of the pads PD3. The surface 501 of the surface treatment layer 500a is substantially aligned with the top surface 113 of the first dielectric layer 110. Since part of the first patterned seed layer 125 is removed, the influence on the signal may be eliminated.

Figure 8:
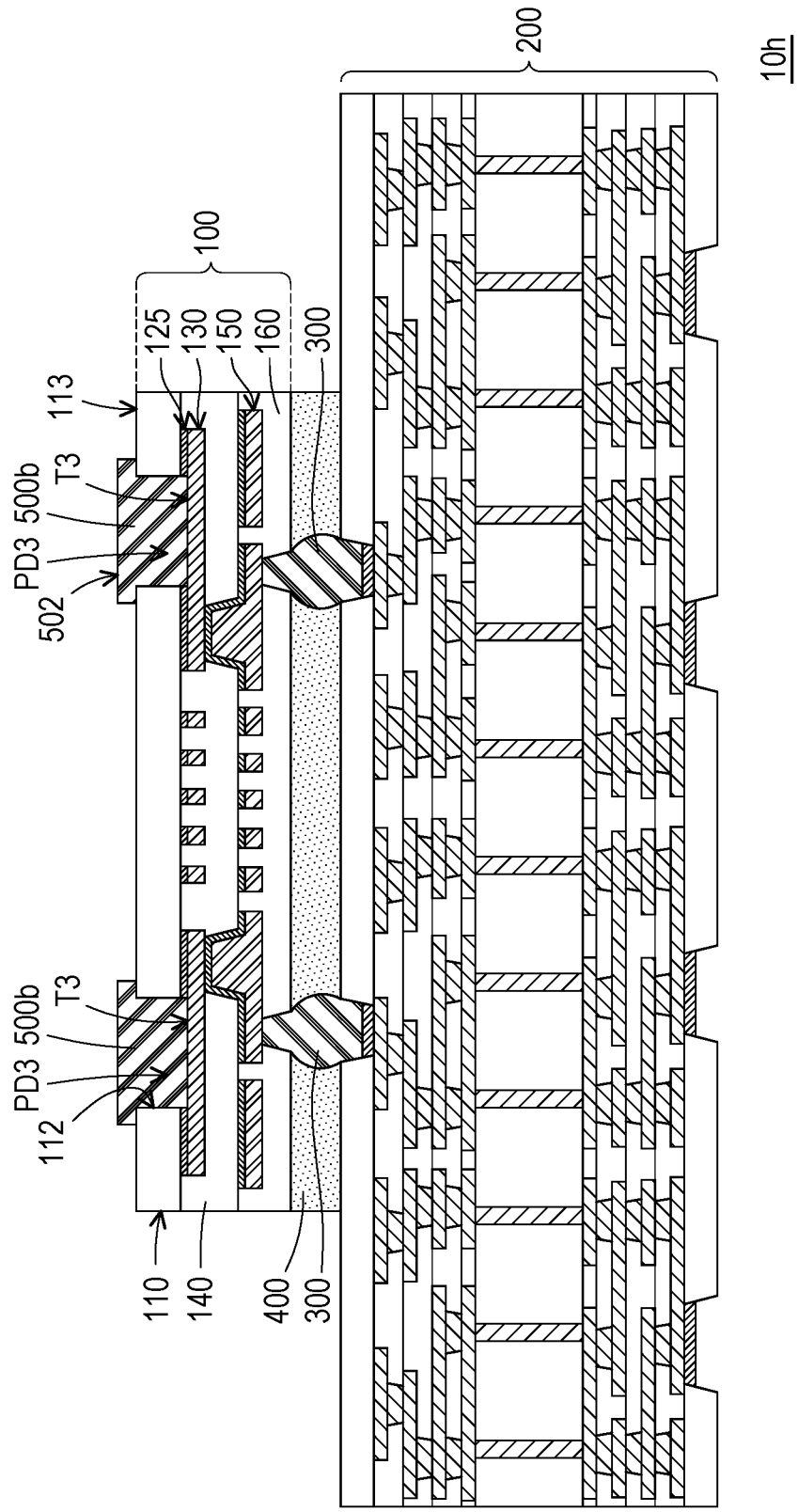
FIG. 8 is a cross-sectional schematic view of a circuit board structure according to another embodiment of the disclosure.

FIG. 8 is a cross-sectional schematic view of a circuit board structure according to another embodiment of the disclosure. With reference to FIG. 7 and FIG. 8 together, a circuit board structure 10h of this embodiment is similar to the circuit board structure 10g in FIG. 7, but the main difference therebetween is that: In this embodiment, the surface 502 of the surface treatment layer 500b protrudes from the top surface 113 of the first dielectric layer 110. In this way, the coverage area of the surface treatment layer 500b may be increased to prevent the first dielectric layer 110 from being damaged.

Figure 9:
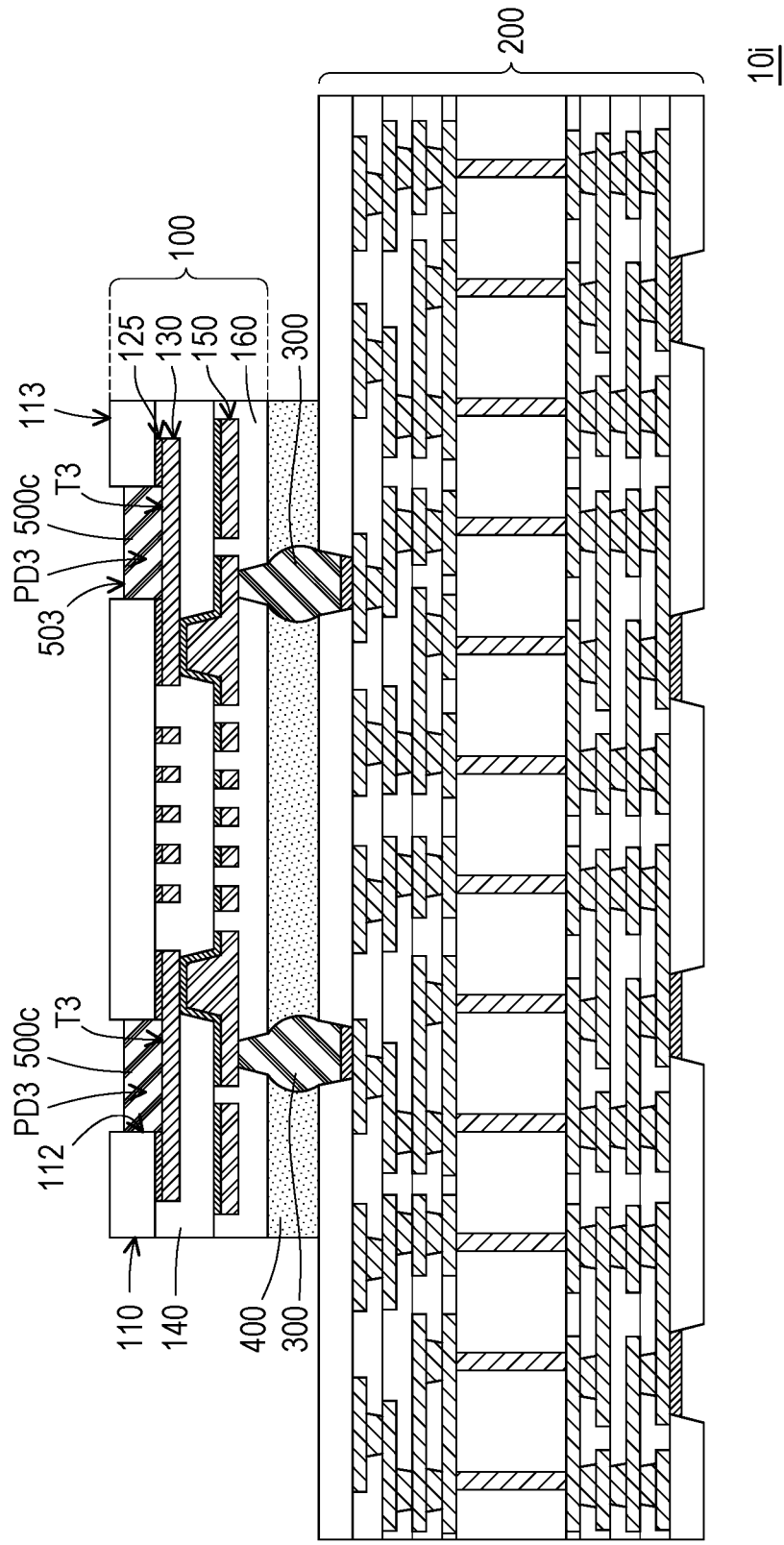
FIG. 9 is a cross-sectional schematic view of a circuit board structure according to another embodiment of the disclosure.

FIG. 9 is a cross-sectional schematic view of a circuit board structure according to another embodiment of the disclosure. With reference to FIG. 7 and FIG. 9 together, a circuit board structure 10i of this embodiment is similar to the circuit board structure 10g in FIG. 7, but the main difference therebetween is that: in this embodiment, the surface 503 of the surface treatment layer 500c is lower than the top surface 113 of the first dielectric layer 110, so that the occurrence of pin slip may be reduced.

In view of the foregoing, in the design of the circuit board structure provided by the disclosure, the top surface of the first dielectric layer is higher than the upper surface of each of the pads. That is, the first dielectric layer may be regarded as a dam, which can effectively prevent the surface treatment layer subsequently formed on the pads from being electrically short-circuited due to the bridge issue caused by the fine space. Therefore, the circuit board structure provided by the disclosure may exhibit good structural reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board structure, comprising:
a carrier;
a thin film redistribution layer disposed on the carrier, wherein the thin film redistribution layer comprises a first dielectric layer, a plurality of pads, a first metal layer, a second dielectric layer, a second metal layer, and a third dielectric layer, the first dielectric layer has a top surface and a first surface opposite to each other and a plurality of first openings, the pads are located in the first openings, and each of the pads has an upper surface, the top surface is higher than the upper surface, the first metal layer is disposed on the first surface of the first dielectric layer, the second dielectric layer covers the first dielectric layer and the first metal layer and has a plurality of second openings exposing part of the first metal layer, the second metal layer is disposed on the second dielectric layer, extends into the second openings, and is electrically connected to the first metal layer, and the third dielectric layer covers the second dielectric layer and the second metal layer and has a plurality of third openings exposing part of the second metal layer;
a plurality of solder balls disposed between the third dielectric layer of the thin film redistribution layer and the carrier and filled in the third openings, wherein the solder balls are electrically connected to second metal layer of the thin film redistribution layer and the carrier; and
a surface treatment layer disposed on the upper surfaces of the pads.

2. The circuit board structure according to claim 1, wherein a surface of the surface treatment layer is aligned with the top surface of the first dielectric layer.

3. The circuit board structure according to claim 1, wherein a surface of the surface treatment layer is lower than the top surface of the first dielectric layer.

4. The circuit board structure according to claim 1, wherein a surface of the surface treatment layer protrudes from the top surface of the first dielectric layer.

5. The circuit board structure according to claim 1, wherein each of the pads also has a second surface opposite to the upper surface, and the second surface is aligned with the first surface of the first dielectric layer.

6. The circuit board structure according to claim 1, wherein the first openings of the first dielectric layer expose part of the first metal layer to be defined as the pads.

7. The circuit board structure according to claim 1, further comprising:
a patterned seed layer disposed on the first metal layer, part of the patterned seed layer is located between the first metal layer and the first dielectric layer, and the first openings of the first dielectric layer expose part of the patterned seed layer to be defined as the pads.

8. The circuit board structure according to claim 1, further comprising:
an underfill filled between the third dielectric layer of the thin film redistribution layer and the carrier and covering the solder balls.

9. The circuit board structure according to claim 1, wherein each of the first dielectric layer, the second dielectric layer, and the third dielectric layer is a photosensitive dielectric layer.

10. A manufacturing method of a circuit board structure, comprising:
forming a thin film redistribution layer on a temporary carrier, wherein the thin film redistribution layer comprises a first dielectric layer, a metal layer, a first metal layer, a second dielectric layer, a second metal layer, and a third dielectric layer, the first dielectric layer and the metal layer are formed on the temporary carrier, the first dielectric layer has a plurality of first openings, the metal layer is located in the first openings, a first surface of the first dielectric layer relatively away from the temporary carrier is aligned with a second surface of the metal layer relatively away from the temporary carrier, the first metal layer is formed on the first dielectric layer and the metal layer, the second dielectric layer covers the first dielectric layer and the first metal layer and has a plurality of second openings exposing part of the first metal layer, the second metal layer is disposed on the second dielectric layer, extends into the second openings, and is electrically connected to the first metal layer, and the third dielectric layer covers the second dielectric layer and the second metal layer and has a plurality of third openings exposing part of the second metal layer;

assembling the thin film redistribution layer onto a carrier through a plurality of solder balls, the solder balls are disposed between the third dielectric layer and the carrier and filled in the third openings, the solder balls are electrically connected to the second metal layer and the carrier;

removing the temporary carrier to expose a top surface of the first dielectric layer and removing at least part of the metal layer to form a plurality of pads after assembling the thin film redistribution layer onto the carrier, wherein the top surface of the first dielectric layer is higher than an upper surface of each of the pads; and forming a surface treatment layer on the pads.

11. The manufacturing method of the circuit board structure according to claim 10, wherein the temporary carrier comprises a glass substrate, a release film, and a seed layer, the release film is located between the glass substrate and the seed layer, and the step of forming the thin film redistribution layer on the temporary carrier comprises:

forming the first dielectric layer on the seed layer, wherein the first openings of the first dielectric layer expose part of the seed layer;

forming the metal layer in the first openings of the first dielectric layer;

forming a first patterned seed layer and the first metal layer thereon on the first dielectric layer and the metal layer;

forming the second dielectric layer on the first dielectric layer;

forming a second patterned seed layer and the second metal layer thereon on the second dielectric layer and in the second openings; and forming the third dielectric layer on the second dielectric layer.

12. The manufacturing method of the circuit board structure according to claim 11, wherein the step of removing the temporary carrier and at least part of the metal layer comprises:

removing the glass substrate and the release film; and
removing the seed layer and part of the metal layer by etching.

13. The manufacturing method of the circuit board structure according to claim 11, wherein the metal layer is completely removed by etching to expose part of the first patterned seed layer to form the pads.

14. The manufacturing method of the circuit board structure according to claim 11, wherein completely removing the metal layer and part of the first patterned seed layer by etching to expose part of the first metal layer to form the pads.

15. The manufacturing method of the circuit board structure according to claim 10, wherein a surface of the surface treatment layer is aligned with the top surface of the first dielectric layer.

16. The manufacturing method of the circuit board structure according to claim 10, wherein a surface of the surface treatment layer is lower than the top surface of the first dielectric layer.

17. The manufacturing method of the circuit board structure according to claim 10, wherein a surface of the surface treatment layer protrudes from the top surface of the first dielectric layer.

18. The manufacturing method of the circuit board structure according to claim 10, further comprising:

filling an underfill between the third dielectric layer of the thin film redistribution layer and the carrier and covering the solder balls before removing the temporary carrier.

19. The manufacturing method of the circuit board structure according to claim 10, wherein each of the first dielectric layer, the second dielectric layer, and the third dielectric layer is a photosensitive dielectric layer.

* * * * *